(12) United States Patent
Watanabe et al.

(10) Patent No.: US 9,257,583 B2
(45) Date of Patent: Feb. 9, 2016

(54) SOLAR CELL

(75) Inventors: Keiji Watanabe, Tokyo (JP); Ryuta Tsuchiya, Tokyo (JP); Takashi Hattori, Tokyo (JP); Mieko Matsumura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 68 days.

(21) Appl. No.: 14/119,195

(22) PCT Filed: May 25, 2011

(86) PCT No.: PCT/JP2011/061955
§ 371 (c)(1),
(2), (4) Date: Feb. 22, 2014

(87) PCT Pub. No.: WO2012/160662
PCT Pub. Date: Nov. 29, 2012

(65) Prior Publication Data
US 2014/0166100 A1    Jun. 19, 2014

(51) Int. Cl.
*H01L 31/00* (2006.01)
*H01L 31/0352* (2006.01)
*H01L 31/0236* (2006.01)

(52) U.S. Cl.
CPC .. *H01L 31/035281* (2013.01); *H01L 31/02366* (2013.01); *H01L 31/03529* (2013.01); *Y02E 10/50* (2013.01)

(58) Field of Classification Search
CPC .............. H01L 31/02366; H01L 31/035281; H01L 31/03529
See application file for complete search history.

(56) References Cited

U.S. PATENT DOCUMENTS

| | | | |
|---|---|---|---|
| 4,155,781 A * | 5/1979 | Diepers | 438/57 |
| 2004/0125266 A1* | 7/2004 | Miyauchi et al. | 349/57 |
| 2005/0095699 A1 | 5/2005 | Miyauchi et al. | |
| 2007/0084505 A1* | 4/2007 | Zaidi | 136/256 |
| 2007/0169808 A1* | 7/2007 | Kherani et al. | 136/258 |

(Continued)

FOREIGN PATENT DOCUMENTS

| | | |
|---|---|---|
| JP | 2003-114316 A | 4/2003 |
| JP | 2003-215305 A | 7/2003 |

(Continued)

OTHER PUBLICATIONS

Wong, et al., "Boosting Short Circuit Current with Rationally Designed Periodic Si Nanopillar Surface Texturing for Thin Film Solar Cell," IEDM Tech. Dig., 2010, pp. 704-707.

(Continued)

*Primary Examiner* — Eli Mekhlin
(74) *Attorney, Agent, or Firm* — Miles & Stockbridge P.C.

(57) ABSTRACT

A solar cell including a substrate 1, a nanopillar 11 having diameter D1 connected to the substrate 1, and a nanopillar 12 having diameter D2 connected to the substrate 1 is characterized in that D2 is greater than D1 in order to realize a solar cell having, as the surface structure, a nanopillar array structure with which it is possible to prevent reflection within the broad wavelength region of solar light. A nanopillar array structure 21 formed from two types of nanopillars having different diameters has a point of minimum reflectivity of a nanopillar array structure formed from the nanopillar 11 having diameter D1 and a point of minimum reflectivity of a nanopillar array structure formed from the nanopillar 12 having diameter D2 and therefore, is capable of preventing reflection within the broad wavelength region of solar light.

15 Claims, 10 Drawing Sheets

(56) References Cited

U.S. PATENT DOCUMENTS

| | | | |
|---|---|---|---|
| 2008/0083963 A1* | 4/2008 | Hsu et al. | 257/431 |
| 2008/0135089 A1 | 6/2008 | Tsakalakos et al. | |
| 2008/0169019 A1 | 7/2008 | Korevaar et al. | |
| 2010/0126577 A1 | 5/2010 | Wu et al. | |
| 2010/0132779 A1 | 6/2010 | Hong et al. | |
| 2011/0135814 A1 | 6/2011 | Miyauchi et al. | |
| 2011/0226937 A1* | 9/2011 | Yu et al. | 250/216 |
| 2012/0097231 A1* | 4/2012 | Lee et al. | 136/255 |

FOREIGN PATENT DOCUMENTS

| | | |
|---|---|---|
| JP | 2007-328096 A | 12/2007 |
| JP | 2009-128543 A | 6/2009 |
| JP | 2009-187025 A | 8/2009 |
| JP | 2010-219495 A | 9/2010 |
| TW | M370833 U1 | 12/2009 |
| TW | 201021220 A | 6/2010 |
| WO | WO 2010150947 A1 * | 12/2010 |

OTHER PUBLICATIONS

Miyajima, "Surface Passivation Films for Crystalline Silicon Solar Cells," The Japan Society of Plasma Science and Nuclear Fusion Research, 2009, vol. 85, No. 12, pp. 820-824.

Office Action issued Sep. 2, 2014, in Japanese Patent Application No. 2013-516117.

Wong, S.M., et al., "Boosting Short Circuit Current with Rationally Designed Periodic Si Nanopillar Surface Texturing for Thin Film Solar Cell," IEDM10-704 —IEDM10-707, 2010 IEEE, pp. 31.2.1-31.2.4.

Extended European Search Report issued Dec. 23, 2014, in European Patent Application No. 11866149.5.

Wong, S.M. et al., "Boosting Short Circuit Current with Rationally Designed Periodic Si Nanopillar Surface Texturing for Thin Film Solar Cell", IEDM Tech. Dig., 2010, pp. 704-707.

Office Action issued May 27, 2014, in Taiwanese Patent Application No. 101116223.

* cited by examiner

SOLAR CELL

TECHNICAL FIELD

The present invention relates to a solar cell.

BACKGROUND ART

In recent years, trials using rugged structures finer than wavelengths of solar light, so-called sub-wavelength structures, are actively carried out as a surface structure of a solar battery cell (for example, Patent Literatures 1 to 3, and Nonpatent Literature 1). Its motive lies in a respect that an antireflection effect higher than that of an antireflection film of a thin film can be achieved by the sub-wavelength structure. As a surface antireflection structure of the solar battery cell, a textured structure formed by wet etching with an alkali solution or acid solution is most generally used at present. It is expected that replacement of this with the sub-wavelength structure make it possible to realize a lower reflectivity and to increase an output current of the solar battery cell. For example, Nonpatent Literature 1 shows that increase of the output current by the antireflection effect is possible by using the nanopillar array structure among the sub-wavelength structures that will be described later as the surface structure of the solar battery cell.

CITATION LIST

Patent Literature

Patent Literature 1: Japanese Unexamined Patent Application Publication No. 2007-328096
Patent Literature 2: Japanese Unexamined Patent Application Publication No. 2010-219495
Patent Literature 3: Japanese Unexamined Patent Application Publication No. 2009-128543

Nonpatent Literature

Nonpatent Literature: IEDM Tech. Dig., pp. 704-707 (2010).

SUMMARY OF INVENTION

Technical Problem

Since further photoelectric conversion efficiency is desired to increase in the next generation solar cell, the inventors have paid attention to the solar battery cell that uses the nanopillar array structure among sub-wavelength structures from a viewpoint of improvement of an antireflection effect and have investigated it. The nanopillar array structure is a structure such that nanopillars 4 of a diameter finer than wavelengths of solar light 3 are arranged periodically on a substrate 1, as shown in FIG. 9. Below, although description will be given taking a cylinder for an example as a shape of the nanopillar 4, the present invention can be applied to cases of other shapes such as a square pillar. Moreover, as shown in FIG. 9, although it is assumed that the solar light 3 travels in a height direction of the nanopillar 4 and enters into the nanopillar array structure from air, the present invention can also be applied to a case where the height direction of the nanopillar 4 and a travel direction of the solar light 3 do not coincide with each other.

A feature of the antireflection effect by the nanopillar array structure will be described. FIG. 10 (*a*) shows a reflectivity spectrum of a Si specular surface, FIG. 10 (*b*) shows one example of a reflectivity spectrum of a Si textured structure, and FIG. 10 (*c*) shows one example of a reflectivity spectrum of a Si nanopillar array structure, respectively. The reflectivity spectra are calculation results by a two-dimensional FDTD method (Finite Differential Time Domain method). Upon comparison of FIG. 10 (*a*) and FIG. 10 (*b*), it is understood that although an absolute value of the reflectivity is reduced by changing a surface shape from the specular surface to the textured structure, a shape of the reflectivity spectrum does not vary. On the other hand, when seeing FIG. 10 (*a*), it is understood that processing the surface into a nanopillar structure makes not only the absolute value of the reflectivity but also the shape of the reflectivity spectrum vary. Specifically, according to FIG. 10 (*a*) and FIG. 10 (*b*), although in a reflectivity spectrum of the case where the surface shape is the specular surface or the textured structure, a point of maximum reflectivity exists in the vicinity of a wavelength of 360 nm, in a wavelength region other than this, a monotonous behavior that the longer the wavelength, the lower the reflectivity becomes is observed. On the other hand, according to FIG. 10 (*c*), multiple points of maximum reflectivity and multiple points of minimum reflectivity exist in the reflectivity spectrum in the case where the surface shape is the nanopillar array structure, and there is a feature that the reflectivity varies non-monotonously to the wavelength. In the nanopillar array structure, diffraction of light takes place and a diffraction condition affects the value of the reflectivity. It is considered that the reflectivity spectrum shows a non-monotonous behavior with multiple maximum points and minimum points because light wavelengths that fulfill the diffraction condition take discrete values.

The dimension parameters that characterize the nanopillar array structure are three: a diameter and a height of the nanopillar and an inter-nanopillar gap. Patent Literature 1 discloses that a reflectivity spectrum of the nanopillar array structure varies depending on the above-mentioned dimension parameters. This is because the above-mentioned diffraction conditions vary depending on the dimension parameters of the nanopillar array structure. In order to use the nanopillar array structure as a surface antireflection structure of the solar battery cell, it is required to reduce the reflectivity in a wavelength region of solar light by adjustment of the above-mentioned dimension parameters. As an application example of the nanopillar array structure to the solar battery cell, a method of providing an uneven shape of a sub-wavelength in a transparent electrode on the surface of the solar battery cell is disclosed in Patent Literature 2, and a method of further providing a sub-wavelength structure on the textured structure is disclosed in Patent Literature 3, respectively. However, as described above, the reflectivity of the nanopillar array structure becomes a minimum only at discrete wavelengths, and increase of a value of the reflectivity is unavoidable at wavelengths between these minimum points. It is difficult to realize a nanopillar array structure capable of preventing reflection of lights over a broad wavelength region like solar light only by adjustment of the above-mentioned dimension parameters. On the other hand, a method of realizing a diffraction grating with a high diffraction efficiency within the broad wavelength region by means of a nanopillar array structure whose dimension parameters are modified using a fact that the diffraction condition of the nanopillar array structure depends on the above-mentioned dimension parameters is disclosed by Patent Literature 1. However, it has not become clear that what kind of role each of the diameter and the height of the nanopillar and the inter-nanopillar gap among the dimension parameters plays in antireflection, respectively, and therefore a method for realizing the nanopillar array structure capable of preventing reflection within the broad wavelength region has not been established conventionally.

The present invention is made in view of this situation, and an object of the invention is to realize a solar battery cell that has, as the surface structure, the nanopillar array structure capable of preventing reflection within the broad wavelength region of solar light. The above-mentioned and other objects of the present invention and new features will become clear from a description and accompanying drawings of this specification.

Solution to Problem

Be briefly described a typical one of the inventions disclosed in the present application, it is as follows. That is, it is a solar cell, which has a substrate, a first nanopillar connected with the substrate, and a second nanopillar connected with the substrate, and is characterized by a diameter of the second nanopillar being larger than a diameter of the first nanopillar.

Advantageous Effects of Invention

According to the present invention, by providing the nanopillars having different diameters, it is possible to realize the solar battery cell that has the nanopillar array structure capable of preventing reflection within the broad wavelength region of solar light.

DESCRIPTION OF EMBODIMENTS

First Embodiment

Figure 1:
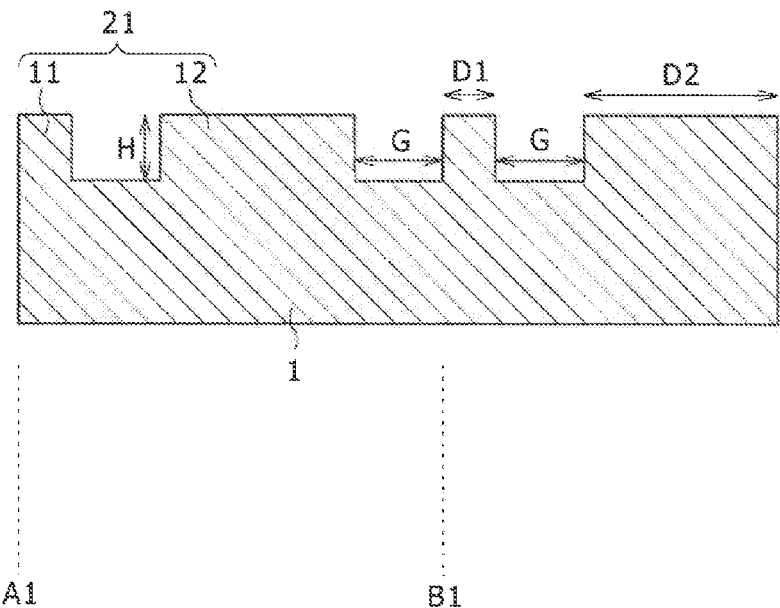
FIG. 1 is a sectional view of a surface structure of a solar battery cell according to a first embodiment of the present invention.

FIG. 1 is a sectional view of a surface structure of a solar battery cell according to a first embodiment of the present invention. Generally, although the solar battery cell is comprised of a pn junction, a passivation film, an electrode, etc., FIG. 1 does not show these explicitly, but shows only a substrate 1 and its surface structure. A feature of the structure of this first embodiment lies at a point of having a nanopillar array structure 21 that is comprised of two types of nanopillars 11, 12 formed on the substrate 1 and having different diameters. FIG. 1 shows the nanopillar array structure 21 comprised of the nanopillar 11 of diameter D1 and the nanopillar 12 of diameter D2. Incidentally, a relationship of the diameters of the nanopillars was set to D1<D2 in this embodiment. Moreover, a pillar height H is set to the same value for both the nanopillar 11 of diameter D1 and the nanopillar 12 of diameter D2. Moreover, as shown in FIG. 1, the solar battery cell is configured so that an inter-pillar gap G may have a constant value everywhere in a plane. As will be described later, a reason that antireflection within a broad wavelength region is possible with the configuration of this first embodiment lies essentially in the use of multiple nanopillars having different diameters, and it is not necessarily required for a value of the inter-nanopillar gap G to take multiple values in the plane. However, as will be shown in below-described FIG. 3 and FIG. 4, there may be a case where it is impossible to set the value of the inter-nanopillar gap G constant everywhere in the plane depending on an arrangement pattern of the nanopillars. Therefore, the structure of this first embodiment shall include a structure such that the value of the inter-nanopillar gap G takes multiple values in the plane. The structure shown in FIG. 1 can be manufactured by forming a resist pattern in which diameters are different using a publicly known photolithography technology and subsequently performing publicly known dry etching using the resist pattern as a mask. Incidentally, a region between a dashed line A1 and a dashed line B1 in FIG. 1 shows a unit structure of the nanopillar array structure.

Figure 2:
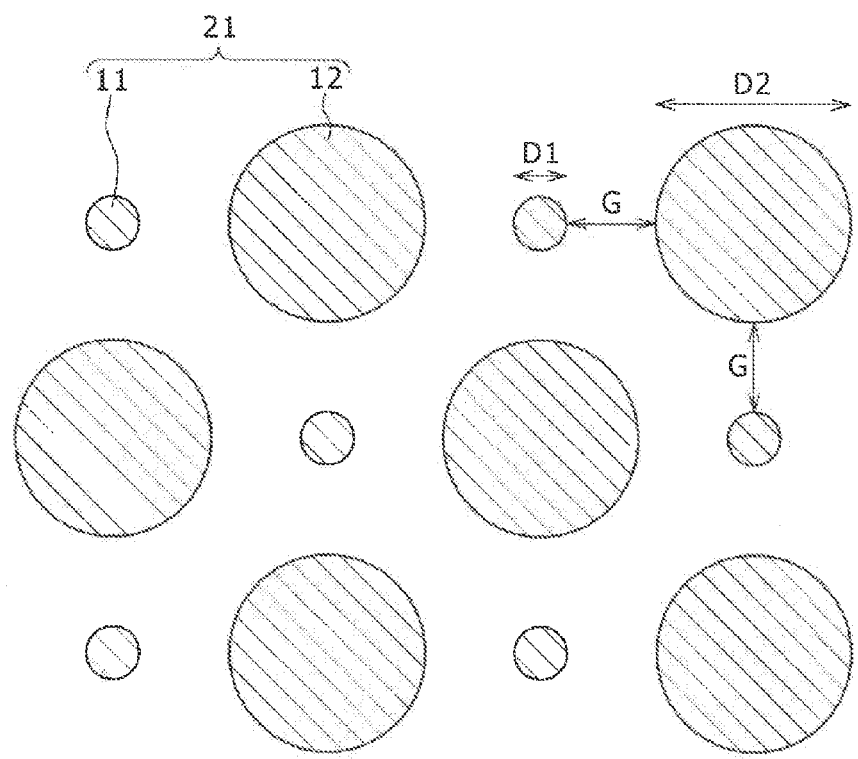
FIG. 2 is a first top view of the surface structure of the solar battery cell according to the first embodiment of the present invention.

FIG. 2 is a first top view of the surface structure of the solar battery cell according to this first embodiment. The substrate 1 is not illustrated. Although FIG. 2 shows a structure in which the nanopillar 11 of diameter D1 and the nanopillar 12 of diameter D2 are arranged in a checkerboard pattern, the arrangement pattern may be other kinds such as a triangular grid. A periodic arrangement is desirable.

In the above, the solar battery cell that has the nanopillar array structure 21 comprised of two types of nanopillars having different diameters was described, but this first embodiment is also applicable to a solar battery cell that has the nanopillar array structure comprised of three or more types of nanopillars having different diameters. Below, two examples in each of which an arrangement pattern of the nanopillar array structure is different will be given as the solar battery cell that has the nanopillar array structure comprised of three types of nanopillars having different diameters.

Figure 3:
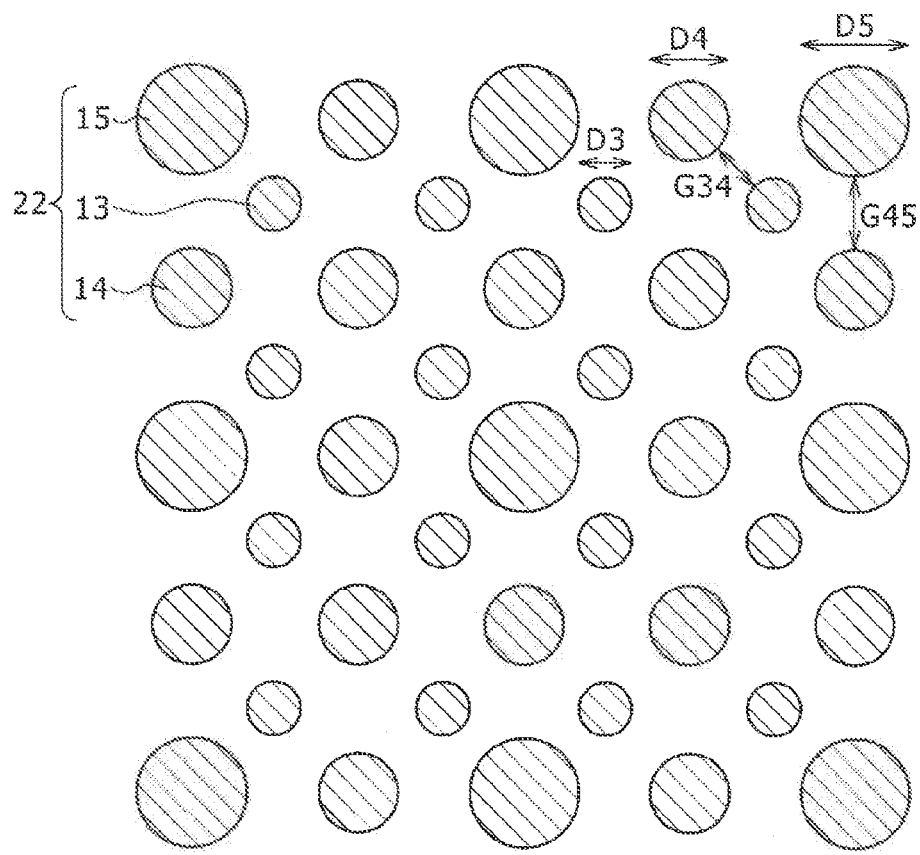
FIG. 3 is a second top view of a surface structure of the solar battery cell according to the first embodiment of the present invention.

FIG. 3 is a second top view of the surface structure of the solar battery cell according to this first embodiment. A feature of the surface structure of the solar battery cell shown in FIG. 3 lies in a respect that it has a first nanopillar array structure 22 comprised of three types of nanopillars having different diameters: a nanopillar 13 of diameter D3, a nanopillar 14 of diameter D4, and a nanopillar 15 of diameter D5. Incidentally, a relationship of the diameters of the nanopillars was set to D3<D4<D5. As described above, in the arrangement pattern shown in FIG. 3, the value of the inter-nanopillar gap G is not constant in the plane and, for example, an inter-nanopillar gap G34 between the nanopillar 13 of diameter D3 and the nanopillar 14 of diameter D4 is smaller than an inter-nanopillar gap G45 between the nanopillar 14 of diameter D4 and the nanopillar 15 of diameter D5.

Figure 4:
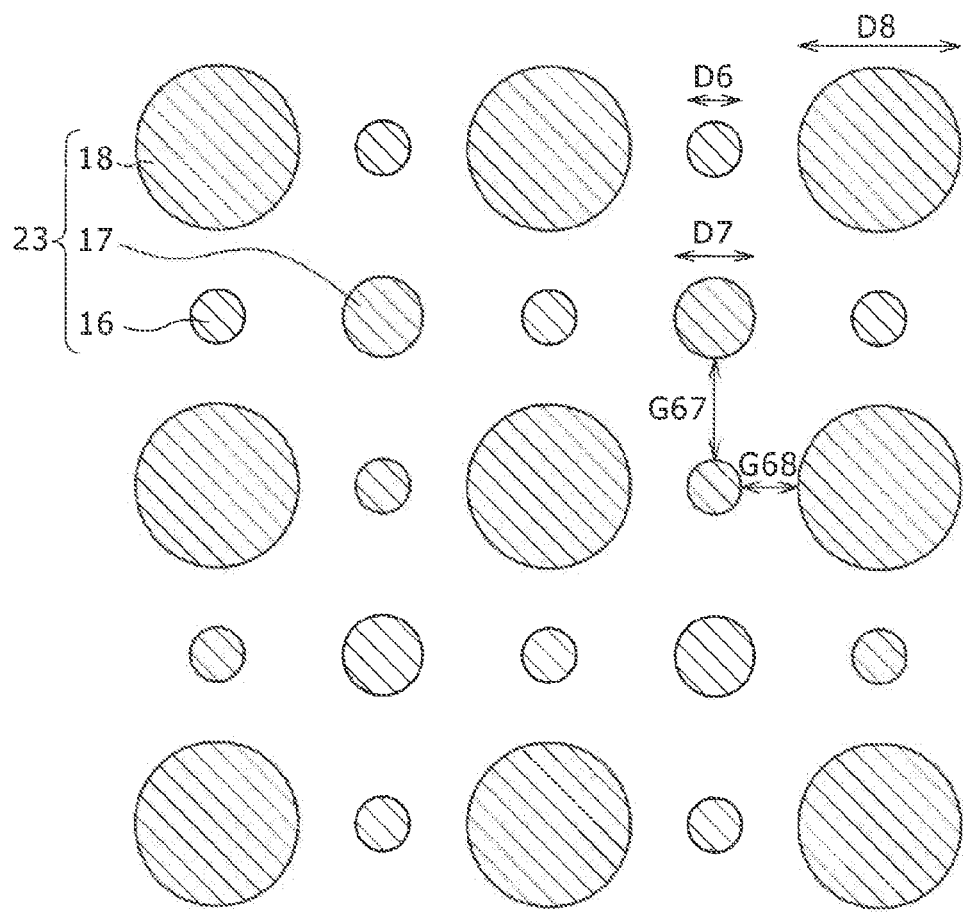
FIG. 4 is a third top view of a surface structure of the solar battery cell according to the first embodiment of the present invention.

FIG. 4 is a third top view of the surface structure of the solar battery cell according to this first embodiment. A feature of the surface structure of the solar battery cell shown in FIG. 4 lies in a respect that it has a second nanopillar array structure 23 comprised of three types of nanopillars having different diameters: a nanopillar 16 of diameter D6, a nanopillar 17 of diameter D7, and a nanopillar 18 of diameter D8. Incidentally, a relationship of the diameters of the nanopillars was set to D6<D7<D8. Also in the arrangement pattern shown in FIG. 4, the value of the inter-nanopillar gap G is not constant in the plane and, for example, an inter-nanopillar gap G67 of the nanopillar 16 of diameter D6 and the nanopillar 17 of diameter D7 is larger than an inter-nanopillar gap G68 of the nanopillar 16 of diameter D6 and the nanopillar 18 of diameter D8.

According to this first embodiment, it is possible to realize the solar battery cell that has a nanopillar array structure capable of preventing reflection within the broad wavelength region of solar light. Below, the reason will be explained. First, a change that appears in a reflectivity spectrum of the nanopillar array structure when changing the dimension parameters of the nanopillar array structure is shown. FIG. 11 (a) shows a calculation result of a reflectivity spectrum of a Si nanopillar array structure of 40 nm in diameter, 200 nm in height, and 40 nm in inter-nanopillar gap. The reflectivity takes a minimum at a wavelength of 460 nm. In this nanopillar array structure, a calculation result of a reflectivity spectrum of a Si nanopillar array structure of 40 nm in diameter, 200 nm in height, and 120 nm in inter-nanopillar gap that is changed only in the inter-nanopillar gap is shown in FIG. 11 (b). A point of minimum reflectivity is a wavelength of 420 nm, which shifts to the short wavelength side by 40 nm compared with a case of the Si nanopillar array structure of 40 nm in diameter, 200 nm in height, and 40 nm in inter-nanopillar gap. On the other hand, a reflectivity spectrum of a Si nanopillar array structure of 120 nm in diameter, 200 nm in height, and 40 nm in inter-nanopillar gap that is changed only in diameter from the Si nanopillar array structure of 40 nm in diameter, 200 nm in height, and 40 nm in inter-nanopillar gap becomes a spectrum having the point of minimum reflectivity at a wavelength of 560 nm, as shown in FIG. 11 (c). A shift amount of the point of minimum reflectivity when the inter-nanopillar gap is changed by 80 nm is 40 nm from a comparison of FIG. 11 (a) and FIG. 11 (b), whereas upon comparison of FIG. 11 (a) and FIG. 11 (c), the shift amount of the point of minimum reflectivity when the diameter is changed by 80 nm is 100 nm. That is, a shift of the point of minimum reflectivity is more remarkable by changing the diameter than by changing the inter-nanopillar gap.

Furthermore, a calculation result of the reflectivity spectrum of a Si nanopillar array structure of 120 nm in diameter, 200 nm in height, and 120 nm in inter-nanopillar gap obtained by changing both the diameter and the inter-nanopillar gap from the Si nanopillar array structure of 40 nm in diameter, 200 nm in height, and 40 nm in inter-nanopillar gap becomes as shown in FIG. 11 (d), and the point of minimum reflectivity exists at a wavelength of 620 nm. The shift amount of the point of minimum reflectivity when the inter-nanopillar gap is changed by 80 nm is 60 nm from a comparison of FIG. 11 (c) and FIG. 11 (d), whereas upon comparison of FIG. 11 (b) and FIG. 11 (d), the shift amount of the point of minimum reflectivity when the diameter is changed by 80 nm is 200 nm. From this, a tendency that the shift of the point of minimum reflectivity is more remarkable by changing the diameter than by changing the inter-nanopillar gap that was obtained from a comparison of the above-mentioned FIG. 11 (a), FIG. 11 (b), and FIG. 11 (c) was reconfirmed. Moreover, from the comparison of FIG. 11 (a) and FIG. 11 (c) and a comparison of FIG. 11 (b) and FIG. 11 (d), a tendency that when the diameter is made to increase, the point of minimum reflectivity shifts to the long wavelength side is understood. On the other hand, in a comparison of FIG. 11 (a) and FIG. 11 (b), when the inter-nanopillar gap is made to increase, the point of minimum reflectivity shifts to the short wavelength side; whereas in a comparison of FIG. 11 (c) and FIG. 11 (d), when the inter-nanopillar gap is made to increase, the point of minimum reflectivity shifts to the long wavelength side. From this, it can be said that a change of the inter-nanopillar gap and a shift of the point of minimum reflectivity are not in a relationship of mutual monotonous increase or monotonous decrease.

Finally, a reflectivity spectrum of a Si nanopillar array structure of 120 nm in diameter, 60 nm in height, and 120 nm in inter-nanopillar gap obtained by changing only the height from the Si nanopillar array structure of 120 nm in diameter, 200 nm in height, and 120 nm in inter-nanopillar gap is shown in FIG. 11 (e). Upon comparison of FIG. 11 (d) and FIG. 11 (e), a feature that the number of the points of minimum reflectivity increases by increasing the height is observed. Moreover, from a fact that a value of the reflectivity obtained by taking a simple average of the reflectivities in wavelengths of 300 nm to 800 nm is 13% in both cases of FIG. 11 (d) and FIG. 11 (e), it is understood that the average of the reflectivity does not vary even when the height is varied.

Summarizing roles of the dimension parameters in the reflectivity spectrum of the nanopillar array structure based on the reflectivity spectra shown in FIG. 11 (a) to FIG. 11 (e), they become as follows. A change of the diameter causes a shift of the point of minimum reflectivity. Specifically, the point of minimum reflectivity shifts to the long wavelength side with the increase in diameter. Moreover, a change of the height causes a variation of the number of the points of minimum reflectivity. Specifically, the number of the points of minimum reflectivity increases with the increase in height. However, the change of the height does not cause a change of the average of the reflectivity. Finally, the change of the inter-nanopillar gap does not affect the number of the points of minimum reflectivity and causes the shift of the point of minimum reflectivity, but a magnitude of the shift is small compared with the shift by the change of the diameter. Furthermore, regarding the shift of the point of minimum reflectivity by the change of the inter-nanopillar gap, it is not decided monotonously whether it is a shift to the long wavelength side, or a shift to the short wavelength side.

In order to realize the nanopillar array structure capable of preventing reflection within the broad wavelength region of solar light, it is expected that a method of using multiple nanopillars having different diameters is effective by considering respective roles of the diameter, the height, and the inter-nanopillar gap described above. That is, since the nanopillar array structures in which diameters are different have different points of minimum reflectivity, it is expected that the nanopillar array structure in which the points of minimum reflectivity exist over the broad wavelength region can be realized by combining them. Below, this expectation will be verified.

Figure 12:
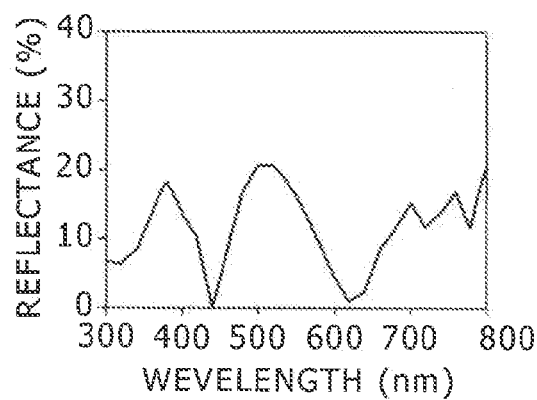
FIG. 12 is a reflectivity spectrum of a Si nanopillar array structure of D1=40 nm, D2=120 nm, H=200 nm, and G=40 nm in the surface structure of the solar battery cell according to the first embodiment of the present invention.

FIG. 12 is a calculation result of a reflectivity spectrum of a Si nanopillar array structure of D1=40 nm, D2=120 nm, H=200 nm, and G=40 nm in the structure shown in FIG. 1. The reflectivity has two minimum points at a wavelength of 440 nm and the wavelength of 620 nm. Since the wavelength of the former almost coincides with the points of minimum reflectivity in FIG. 11 (a) and FIG. 11 (b), it is understood that it is the point of minimum reflectivity resulting from the nanopillar of 40 nm in diameter. On the other hand, since the wavelengths of the latter almost coincide with the points of minimum reflectivity in FIG. 11 (c) and FIG. 11 (d), it is understood that it is the point of minimum reflectivity resulting from the nanopillar of 120 nm in diameter. This gives evidence for the expectation that the nanopillar array structure that is capable of preventing reflection within the broad wavelength region and has the points of minimum reflectivity resulting from respective diameters simultaneously by combining multiple nanopillars having different differs is realizable. Showing the effect of this first embodiment with values of the reflectivity that are weight-averaged with respect to a photon number spectrum of solar light, the average reflectivity of the Si nanopillar array structure of 40 nm in diameter, 200 nm in height, and 40 nm in inter-nanopillar gap is 16.0%, and the average reflectivity of the Si nanopillar array structure of 120 nm in diameter, 200 nm in height, and 120 nm in inter-nanopillar gap is 13.3%; whereas in the structure shown in FIG. 1, an average reflectivity of the Si nanopillar array structure of D1=40 nm, D2=120 nm, H=200 nm, and G=40 nm is 11.5%, in the structure shown in FIG. 3, an average reflectivity of a Si nanopillar array structure of D3=40 nm, D4=60 nm, D5=120 nm, H=200 nm, and G=40 nm calculated by a two-dimensional FDTD method is 9.2%, and therefore it has turned out that it can improve an antireflection effect compared with the conventional nanopillar.

Moreover, since the sub-wavelength structure such as the nanopillar also has an effect of optical confinement, it is possible to attain securing of optical absorption of the solar battery cell and reduction of the thickness of an optical absorption layer simultaneously. The reduction of the thickness of the optical absorption layer not only reduces a material cost but also shortens a carrier migration length inside the solar battery cell, and thereby it can suppress recombination and increase an output voltage of the solar battery cell.

The above is a reason that it is possible to realize the solar battery cell that has the nanopillar array structure capable of preventing reflection within the broad wavelength region of solar light according to this first embodiment. In the structure of this first embodiment, a numeric value range of especially suitable dimension parameters will be written. In the case of the nanopillar array structure comprised of two types of nanopillars having different diameters, it is desirable to combine a nanopillar of 20 to 50 nm (less than 50 nm) in diameter and a nanopillar of 50 to 150 nm in diameter. In the case of the nanopillar array structure comprised of three types of nanopillars having different diameters, it is desirable to combine the nanopillar of 20 to 50 nm (less than 50 nm) in diameter, a nanopillar of 50 to 90 nm (less than 90 nm) in diameter, and a nanopillar of 90 to 150 nm in diameter. Regarding the height, it is desirable that it is more than or equal to 100 nm in order to realize antireflection, and it is desirable from a viewpoint of manufacturing possibility that it is less than or equal to 1000 nm. Although the inter-nanopillar gap has a small influence exerted on the shift of the point of minimum reflectivity compared with the diameter, as described above, it cannot be a fully arbitrary value at all. In order to control the shift of the point of minimum reflectivity, it is desirable that a size of the inter-nanopillar gap is in a range of ⅕ to five times the diameter. Moreover, at the time of formation of the nanopillar, a taper usually occurs on the shape of the nanopillar. When the inter-nanopillar gap is small, there is also an apprehension that the nanopillar of a desired height is not obtained because tapers of adjacent nanopillars come in contact. When setting up the size of the inter-nanopillar gap, it is necessary to also consider the point.

In the structure of this first embodiment, a material that the nanopillar includes is a semiconductor material used for the optical absorption layer of the solar battery cell, or a semiconductor material or insulation material used for the passivation film or a buffer layer, or a transparent conducting film material, or a laminated product of these materials. The semiconductor materials used for the optical absorption layer of the solar battery cell are Si, CdTe, CuInGaSe, InP, GaAs, Ge, etc., and these can take various structures such as a single crystal, a polycrystal, a crystallite, and amorphous. These semiconductor layers may be the substrate 1 as itself, and may be formed by film formation methods such as a CVD method, a sputtering method, an epitaxy method, and a vapor deposition method. The semiconductor materials or insulation materials that are used for the passivation film and the buffer layer are $SiO_2$, SiN (silicon nitride), amorphous Si, CdS, etc. Formation of these semiconductor materials or insulation materials may be performed by oxidization, nitriding, etc. of the semiconductor material used for the above-mentioned optical absorption layer of the solar battery cell, or these may be formed by film formation methods such as the CVD method, the sputtering method, the epitaxy method, and the vapor deposition method. The transparent conducting film materials are oxides containing such elements as In, Zn, Sn, Ga, etc. and compound oxides of them, to which additives such as fluoride may be added. Formation of these transparent conducting film materials is performed by the sputtering method, the CVD method, an application method, a printing method, etc. Moreover, in addition to the above-mentioned process, heat treatment, plasma treatment, etc. for improving crystallinity and quality of each film or for improving quality of an interface with an adjacent film.

Although photolithography and dry etching were used as the manufacturing method of the structure of this first embodiment, publicly known methods of performing photolithography such as electron beam lithography and etching, and processing nanoimprint, etching using nano particles as a mask, etc. on a flat surface of the substrate 1 or a film formed on the flat surface of the substrate 1, and publicly known methods of making the nanopillars grow by a VLS (Vapor-Liquid-Solid) method etc. on the flat surface of the substrate 1 can also be used. In the manufacturing method by lithography and etching, especially in the case where "height/diameter" of the nanopillar, i.e., an aspect ratio, is two or more, it is desirable to first form a hard mask on the substrate 1, then to apply a resist, and to perform lithography. Especially, in the case where the substrate 1 is Si, it is desirable to use a two-layer structure comprised of $SiO_2$ and amorphous Si stuck in this order from the near side to the substrate 1 as the hard mask. In that case, it is desirable to perform processing by dry etching amorphous Si and the Si substrate using a gas whose main component is HBr and by dry etching $SiO_2$ using a gas whose main component is $CHF_3$, respectively. In the manufacturing method by the VLS method, it is desirable to form a substance having a catalytic effect required for growth of the nanopillar as necessary.

As a result of manufacturing the solar cell that has the nanopillars of the structure shown in FIG. 2 to FIG. 4 by the method described above, an excellent characteristic was obtained.

As mentioned above, according to this embodiment, it is possible to provide the solar cell that can prevent reflection within the broad wavelength region of solar light by equipping the substrate with the nanopillars having different diameters.

Second Embodiment

Figure 13A:
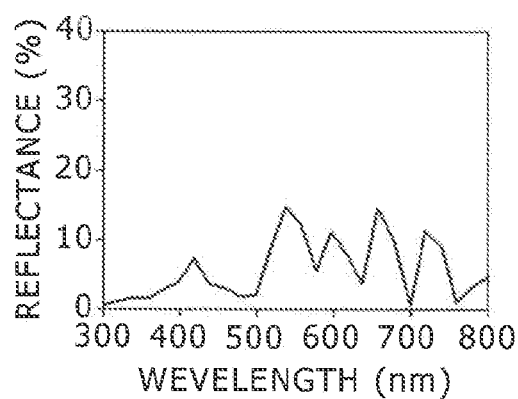
FIG. 13 (a) is a reflectivity spectrum of a Si nanopillar array structure of D1=40 nm, D2=120 nm, H1=200 nm, H2=800 nm, and G=40 nm in the surface structure of the solar battery cell according to the second embodiment of the present invention, and (b) is a light intensity distribution along a height direction of the nanopillar in the Si nanopillar array structure of 120 nm in diameter, 600 nm in height, and 120 nm in inter-nanopillar gap.
Figure 13B:
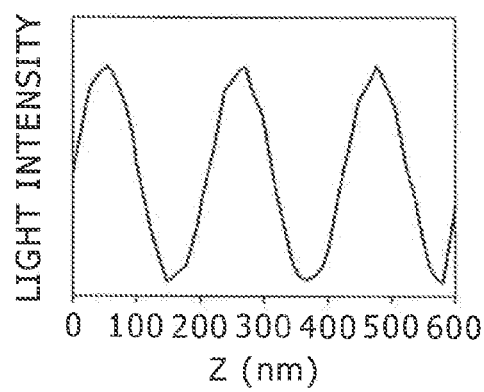

A second embodiment will be described using FIG. 5, FIG. 6, and FIG. 13. Incidentally, particulars that were described in the first embodiment and are not described in this embodiment can be applied to this embodiment unless there are special circumstances.

Figure 5:
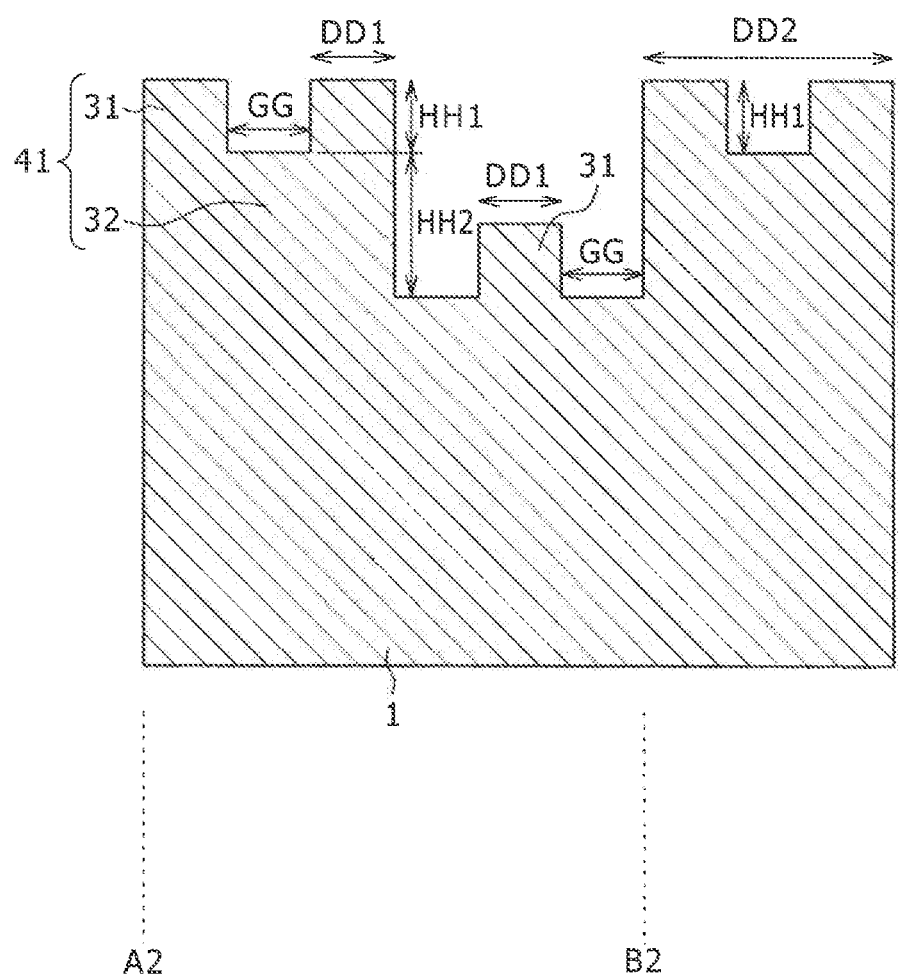
FIG. 5 is a sectional view of a surface structure of the solar battery cell according to a second embodiment of the present invention.

FIG. 5 is a sectional view of a surface structure of a solar battery cell according to a second embodiment of the present invention. Speaking a difference from the first embodiment, the structure of the first embodiment is characterized by being configured with multiple nanopillars having different diameters, whereas the structure of the second embodiment is characterized by being configured with multiple nanopillars having both different diameters and different heights. FIG. 5 shows a nanopillar array structure 41 comprised of two types of nanopillars, i.e., a nanopillar 31 of diameter DD1 and height HH1 and a nanopillar 32 of diameter DD2 and height HH2. Incidentally, in this embodiment, a relationship of diameters of the nanopillars and a relationship of the heights thereof were set to DD1<DD2 and HH1<HH2, respectively. Moreover, although in FIG. 5, the configuration was specified so that an inter-nanopillar gap GG has a constant value everywhere in the plane, the structure of this second embodiment shall also include a structure where the value of the inter-nanopillar gap GG takes multiple values in the plane like the case of the first embodiment.

Figure 6:
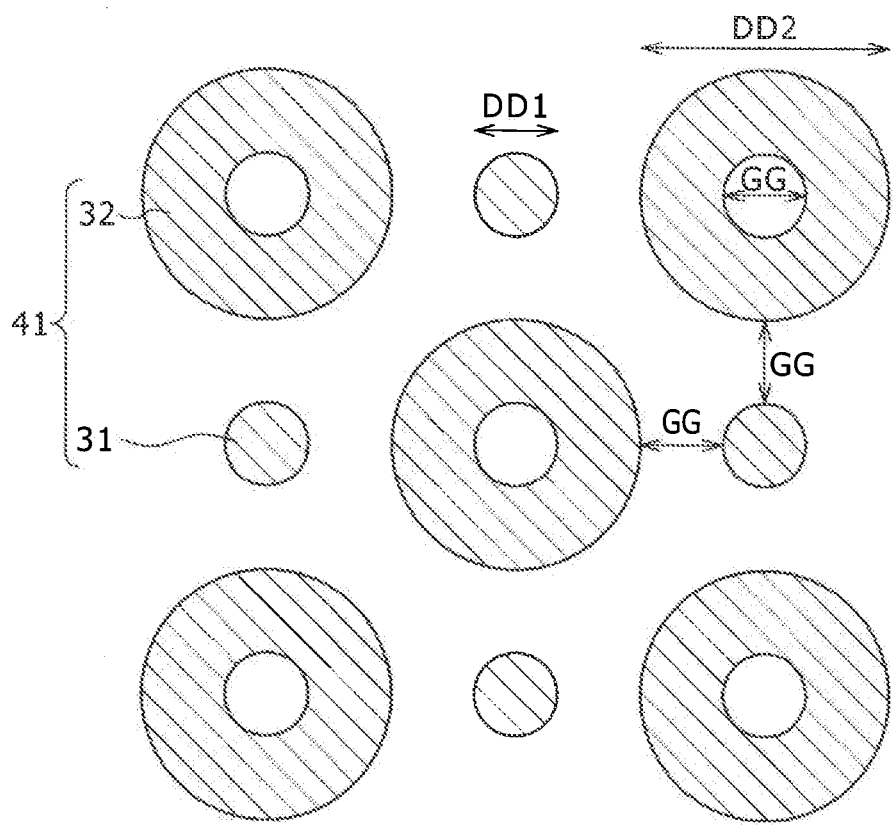
FIG. 6 is a top view of the surface structure of the solar battery cell according to the second embodiment of the present invention.

FIG. 6 is a top view of the surface structure of the solar battery cell according to this second embodiment. Although FIG. 6 shows a structure in which the nanopillar 31 of diameter DD1 and height HH1 and the nanopillar 32 of diameter DD2 and height HH2 are arranged in the shape of a checkered pattern, a structure comprised of another arrangement pattern such as a triangular grid may be used.

According to this second embodiment, it is possible to realize the solar battery cell that has the nanopillar array structure capable of preventing reflection within the broad wavelength region of solar light like the first embodiment, and to realize a reflectivity lower than that of the structure of the first embodiment. First, the former effect will be described. In the structure shown in FIG. 5, FIG. 13 (a) shows a calculation result of a reflectivity spectrum of a Si nanopillar array structure of DD1=40 nm, DD2=120 nm, HH1=200 nm, HH2=600 nm, and GG=40 nm. This Si nanopillar array structure is comprised of the Si nanopillar array structure of 40 nm in diameter, 200 nm in height, and 40 nm in inter-nanopillar gap and a Si nanopillar array structure of 120 nm in diameter, 600 nm in height, and 120 nm in inter-nanopillar gap. A reflectivity spectrum of the former is shown in FIG. 11 (a), and a reflectivity spectrum of the latter is shown in FIG. 11 (e), respectively. It is understood that the reflectivity spectrum shown in FIG. 13 (a) has all the points of minimum reflectivity seen in the reflectivity spectra shown in FIG. 11 (a) and FIG. 11 (e). This has shown that it is possible to realize the solar battery cell that has the nanopillar array structure capable of preventing reflection within the broad wavelength region of solar light by the structure of this second embodiment like the first embodiment. However, realization of the solar battery cell that has the nanopillar array structure capable of preventing reflection within the broad wavelength region of solar light like the first embodiment by the structure of this second embodiment comes with the following conditions. FIG. 13 (b) shows a light intensity distribution in a region of the inter-nanopillar gap when light of the wavelength of 460 nm is made to be incident on the Si nanopillar array structure of 120 nm in diameter, 600 nm in height, and 120 nm in inter-nanopillar gap in a direction shown in FIG. 9. Generally, when light is made to be incident on the nanopillar array structure, stationary waves occur in the region of the inter-nanopillar gap. Denoting a height direction of the nanopillar as a z-direction, the stationary waves occur discretely in a space, at z=Z1, Z2, Z3 . . . . However, denoting the upper surface of the nanopillar as z=0, the height of the nanopillar as H, and an interface between the nanopillar and the substrate as z=H, 0<Z1<Z2<Z3< . . . <H holds. In FIG. 13 (b), these parameters are Z1=60 nm, Z2=270 nm, and Z3=480 nm. Here, the stationary waves occurring at z=Z1, Z2 . . . shall be called a first stationary wave, a second stationary wave, and . . . , respectively. At the time of 0<H<Z1, no stationary waves exist, at the time of Z1<H<Z2, only the first stationary wave exists, and at the time of Z2<H<Z3, the first stationary wave and the second stationary wave exist. In order to perform antireflection by the nanopillar array structure, it is required for at least the first stationary wave to exist. In the structure of this second embodiment, as shown in FIG. 5, the nanopillar 31 of diameter DD1 and height HH1 is formed in an inter-nanopillar gap region between the nanopillars 32 of diameter DD2 and height HH2. At this occasion, denoting a top surface of the nanopillar 31 of diameter DD1 and height HH1 on the nanopillar 32 of diameter DD2 and height HH2 as z=0, denoting an interface between the nanopillar 32 of diameter DD2 and height HH2 and the substrate 1 as z=HH1+HH2, and denoting occurrence positions of the stationary waves as z=z1, z2, z3, . . . , in order to fulfill the condition described above that at least the first stationary wave exists, Z1<HH2 needs to hold. Therefore, summarizing the condition to realize the solar battery cell that has the nanopillar array structure capable of preventing reflection within the broad wavelength region of solar light like the first embodiment by the structure of this second embodiment, it goes that a difference of height between multiple nanopillars that are included in the structure of this second embodiment needs to be at least large enough to allow the first stationary wave to exist in the inter-nanopillar gap region.

Next, a point that a reflectivity lower than that of the structure of the first embodiment among effects of the structure of this second embodiment is realizable will be described. As described above, in the case of the structure of the first embodiment, the average reflectivity of the Si nanopillar array structure of D1=40 nm, D2=120 nm, H=200 nm, and G=40 nm in FIG. 1 was 11.5%. On the other hand, in the case of the structure of this second embodiment, the average reflectivity of the Si nanopillar array structure of DD1=40 nm, DD2=120 nm, HH1=200 nm, HH2=600 nm, and GG=40 nm in FIG. 5 was 7.1%. That is, even when values of two types of diameters are the same, the structure of this second embodiment has an average reflectivity lower than that of the structure of the first embodiment. This reason results from a different of the number of nanopillars contained in the unit structure of the nanopillar array. In the case of the structure of the first embodiment, the unit structure of the nanopillar array indicates a region between the dashed line A1 and the dashed line B1 in FIG. 1, and in the case of the structure of this second embodiment, it indicates a region between a dashed line A2 and a dashed line B2 in FIG. 5. When paying attention to the number of the nanopillars contained in these unit structures, although the nanopillar having a large diameter is unity in both structures of the first embodiment and this second embodiment, the nanopillar having a small diameter is only unity in the structure of the first embodiment, whereas the nanopillars are three in the structure of this second embodiment. As described above, since the stationary waves occur in the inter-nanopillar gap in the nanopillar array structure, remarkable optical absorption occurs on the side of the nanopillar. Therefore, increasing the number of the nanopillars leads to enhancement of the antireflection effect by bringing out increment of the amount of absorbed light, i.e., reduction of the amount of light reflected to the outside.

Summarizing the above, although the structure of this second embodiment has no difference from the structure of the first embodiment in terms of being comprised of multiple nanopillars having different diameters, it is possible to realize a lower reflectivity by increasing the number of the nanopillars contained in the unit structure than the structure of the first embodiment.

As the manufacturing method of the structure of this second embodiment, there are: a method of performing lithography such as electron beam lithography and etching, and processing nanoimprint, etching using nano particles as a mask, etc. on the flat surface of the substrate 1 like the manufacturing method of the structure of the first embodiment; and a method of making the nanopillars grow on the flat surface of the substrate 1 by the VLS (Vapor-Liquid-Solid) method etc. In this second embodiment, in order to form multiple nanopillars having different heights, for example, it is necessary to take a method of performing lithography and etching over multiple times.

By the method described above, the excellent characteristic was obtained as a result of manufacturing the solar cell that has the nanopillars of a configuration shown in FIG. 5.

As described above, according to this embodiment, the same effect as that of the embodiment can be attained. Moreover, by disposing a ring whose width is equal to the diameter of the small nanopillar and whose height is equal to the height of the small nanopillar in a surrounding on the pillar having a large diameter, it is possible to realize the unit structure of the nanopillar array structure with a reflectivity lower than that of the first embodiment.

Third Embodiment

A third embodiment will be described using FIG. 7, FIG. 8, FIG. 15, and FIG. 16. Incidentally, particulars that were described in the first or second embodiment and are not described in this embodiment can also be applied to this embodiment unless there are special circumstances.

Figure 7:
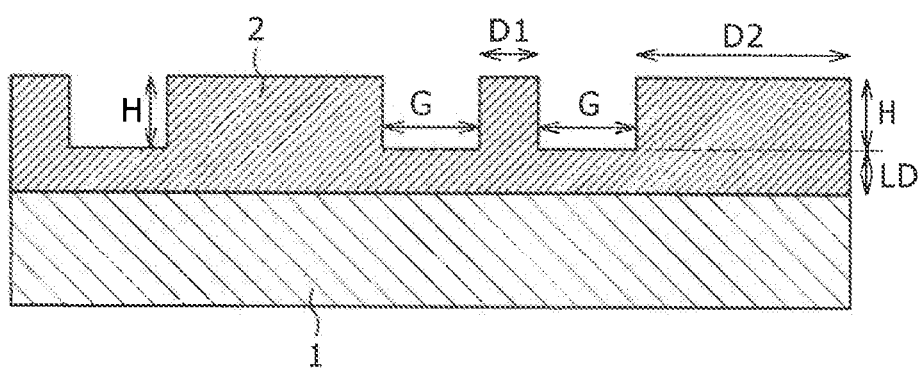
FIG. 7 is a sectional view of a surface structure and an impurity layer of a solar battery cell according to a third embodiment of the present invention.

FIG. 7 is a sectional view of a surface structure and its impurity layer of a solar battery cell according to a third embodiment of the present invention. The structure shown in FIG. 7 is a structure that is made by forming an impurity layer 2 on the surface structure of the solar battery cell according to the first embodiment, and is characterized in that the interface of a pn junction of the n-type semiconductor substrate 1 and the p-type impurity layer 2 is flat over in the plane. Although in this embodiment, the substrate is made n-type and the impurity layer is made p-type, the substrate and the impurity layer can be made p-type and n-type, respectively. Incidentally, in the case of the pin junction, the interface of the pin junction is flat. Moreover, in order to attain an effect of this third embodiment that will be described later, it is characterized by the height of the nanopillar being less than or equal to 500 nm. Moreover, although FIG. 7 shows the case where the surface structure of the solar battery cell is the structure of the first embodiment, in order to attain the effect of this third embodiment, the surface structure of the solar battery cell may be the structure of the second embodiment. In that case, it is characterized in that among multiple nanopillars having different heights in the structure of the second embodiment, a pn junction interface of the substrate 1 and the impurity layer 2 is flat and a height of at least one nanopillar is less than or equal to 500 nm.

According to this third embodiment, in the solar battery cell that has the nanopillar array structure on its surface, it is possible to set so that a transverse direction resistance of the impurity layer 2 may be identical to that of the case of the solar battery cell whose surface is a flat surface, and the number of photocarriers occurring in the impurity layer 2 may be within a range of one to 1.33 times that of the case of the solar battery cell whose surface is a flat surface. Below, these effects will be explained.

The impurity layer 2 plays a role of being an impurity layer comprised of the pn junction or pin junction of the solar battery cell. Generally, inside the solar battery cell, an electron hole pair is generated by the optical absorption, subsequently the electron and the hole separate, and they move to mutually different electrodes, whereby electric power is generated. When the electron and the hole move to the mutually different electrodes in a process among those processes, the electron when the impurity layer 2 is the n-type semiconductor or the hole when the impurity layer 2 is the p-type semiconductor moves in the impurity layer 2 in a transverse direction, respectively. The electric resistance accompanying migration of the electron or hole in the transverse direction at this time is called a transverse migration resistance of the impurity layer 2. The transverse migration resistance of the impurity layer 2 is included in a part of a series resistance of the solar battery cell. In order to prevent characteristics degradation of the solar cell, reduction of a series resistance is required and, for that purpose, a lower transverse migration resistance of the impurity layer 2 is desirable. The transverse migration resistance of the impurity layer 2 can be reduced by increasing the film thickness of the impurity layer 2. However, an increase of the film thickness of the impurity layer 2 causes the number of photocarriers that occur and recombine in the impurity layer 2 to increase, which brings about the characteristics degradation of the solar battery cell. Therefore, the transverse migration resistance of the impurity layer 2 and the number of photocarriers occurring in the impurity layer 2 are in a mutual trade-off relationship, and it is required to set up the film thickness of the impurity layer 2 so as to optimize the characteristics of the solar cell in this relationship.

Figure 8:
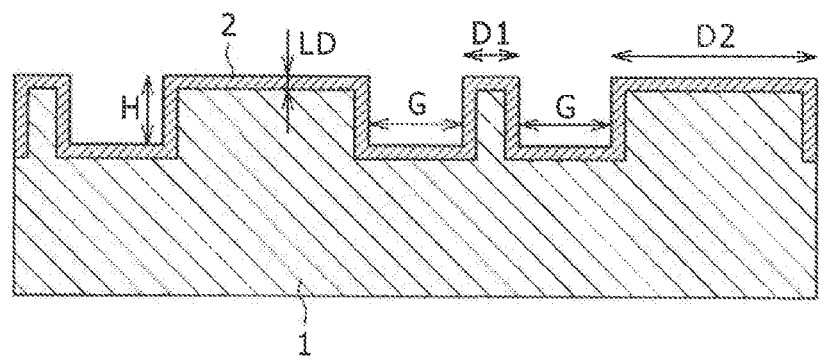
FIG. 8 is a sectional view of the surface structure and an impurity layer of another solar battery cell according to the third embodiment of the present invention.

Shapes of the impurity layer 2 in the solar battery cell that has the nanopillar array structure on its surface are the following two shapes. One is a structure of this third embodiment shown in FIG. 7, and another is a structure shown in FIG. 8. Below, the structure of the solar battery cell shown in FIG. 8 is called a structure of the other solar battery cell of this third embodiment. A structure of the other solar battery cell is one such that a p-type impurity layer 2 is formed by performing isotropic diffusion of a p-type impurity on the surface structure of the solar battery cell according to the first embodiment, and is characterized in that an interface of the pn junction of the n-type substrate 1 and the p-type impurity layer 2 is formed along a surface shape of the nanopillar array structure. The structure of the solar battery cell shown in FIG. 7 and the structure of the other solar battery cell shown in FIG. 8 have an equal film thickness of the impurity layer 2 in a region where no nanopillars exist. Below, in the structure of the solar battery cell shown in FIG. 7, the film thickness of the impurity layer 2 in the region where no nanopillars exist is denoted as LD. A difference between the structure of the solar battery cell shown in FIG. 7 and the structure of the other solar battery cell shown in FIG. 8 is a shape of the impurity layer 2 inside the nanopillar. In the structure of the solar battery cell shown in FIG. 7, the impurity layer 2 includes the whole nanopillars, and is further formed in a region under the nanopillars throughout a depth LD. On the other hand, in the structure of the other solar battery cell shown in FIG. 8, the impurity layer 2 is formed along the surface shape of the nanopillar array structure throughout the depth LD, and a region other than the impurity layer 2 exists in the inside of the nanopillar. Incidentally, although the structure of the solar battery cell shown in FIG. 7 can be realized not depending on a value of the film thickness LD of the impurity layer 2, the structure of the other solar battery cell shown in FIG. 8 can be realized only in the case of LD<D/2 and LD<H.

Figure 9:
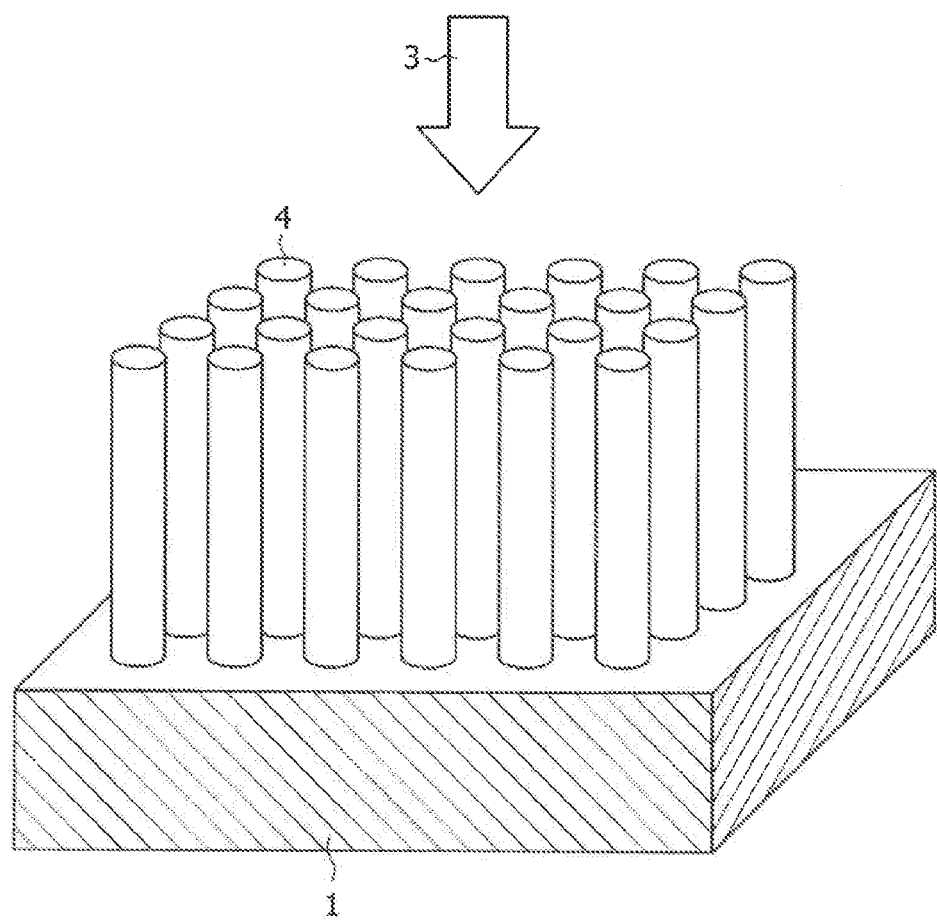
FIG. 9 is a bird's-eye view of a conventional solar battery cell that has a nanopillar array structure on its surface.
Figure 10A:
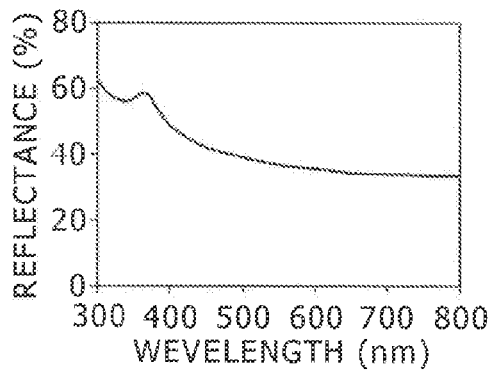
FIG. 10 shows reflection spectra, in which (a) is the case of a Si specular surface, (b) is one example of the case of a Si textured structure, and (c) is one example of the case of a Si nanopillar array structure.
Figure 10B:
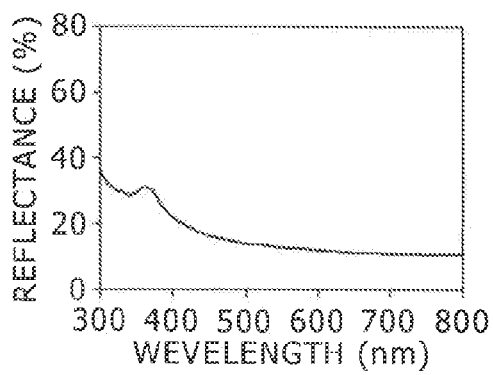
Figure 10C:
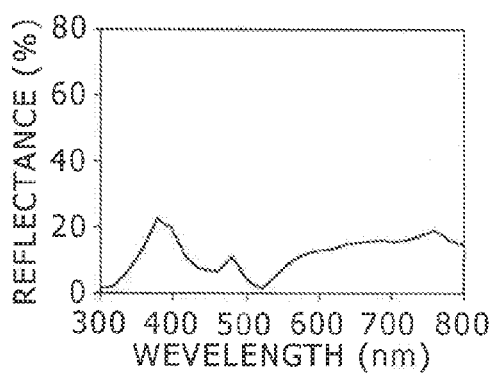
Figure 11A:
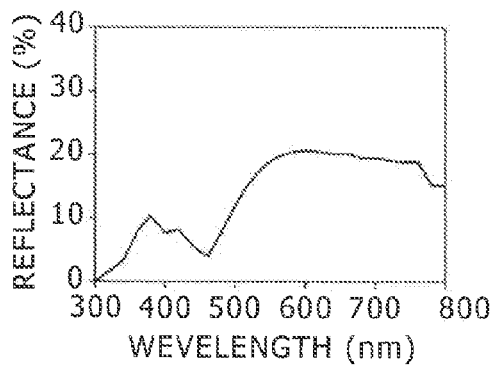
FIG. 11 shows reflection spectra, in which (a) is the case of a Si nanopillar array structure of 40 nm in diameter, 200 nm in height, and 40 nm in inter-nanopillar gap; (b) is the case of a Si nanopillar array structure of 40 nm in diameter, 200 nm in height, and 120 nm in inter-nanopillar gap; (c) is the case of a Si nanopillar array structure of 120 nm in diameter, 200 nm in height, and 40 nm in inter-nanopillar gap; (d) is the case of a Si nanopillar array structure of 120 nm in diameter, 200 nm in height, and 120 nm in inter-nanopillar gap; and (e) is the case of a Si nanopillar array structure of 120 nm in diameter, 600 nm in height, and 120 nm in inter-nanopillar gap.
Figure 11B:
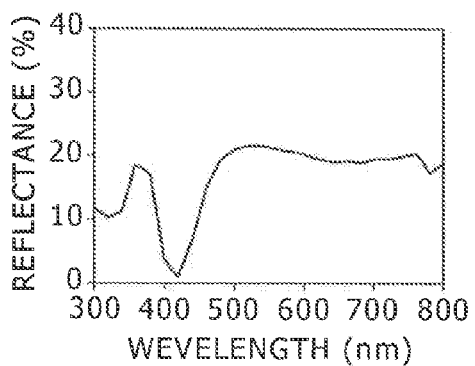
Figure 11C:
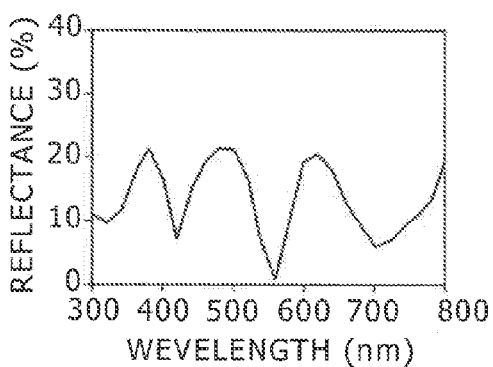
Figure 11D:
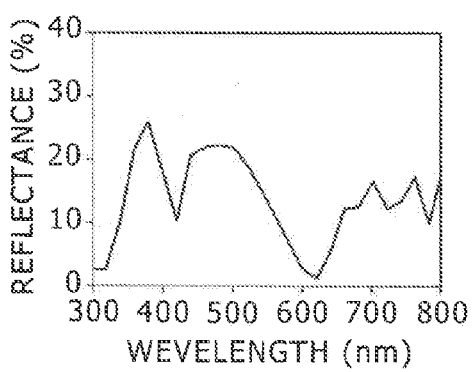
Figure 11E:
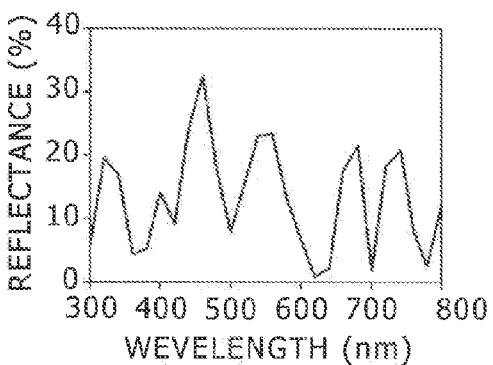

How the transverse migration resistance of the impurity layer 2 and the number of photocarriers occurring in the impurity layer 2 vary both in the structure of the solar battery cell shown in FIG. 7 and in the structure of the other solar battery cell shown in FIG. 8 in comparison with the case of the solar battery cell whose surface is a flat surface will be described. Here, in the solar battery cell whose surface is a flat surface, the impurity layer 2 of depth LD shall be formed over in the plane. As described above, since in the structure of the solar battery cell shown in FIG. 7, the interface of the pn junction of the substrate 1 and the impurity layer 2 becomes flat over in the plane, the migration length when an electron or hole moves in the impurity layer 2 in the transverse direction, i.e., the transverse migration resistance of the impurity layer 2, becomes identical to that of the case of the solar battery cell whose surface is a flat surface. On the other hand, the film thickness of the impurity layer 2 becomes LD in a region where no nanopillars exist and becomes H+LD in a region where the nanopillars exist. Among these, in the region where the nanopillars exist, the film thickness of the impurity layer 2 increases compared with the solar battery cell whose surface is a flat surface, and therefore the number of photocarriers occurring in the impurity layer 2 increases. On the other hand, in the structure of the other solar battery cell shown in FIG. 8, the impurity layer 2 exists along the surface shape of the nanopillar array structure throughout the depth LD. As a result, the migration length when an electron or hole migrates in the impurity layer 2 in the transverse direction is long compared with the case of the solar battery cell whose surface is a flat surface. For this reason, the transverse migration resistance of the impurity layer 2 becomes high compared with the case of the solar battery cell whose surface is a flat surface. On the other hand, the thickness of the impurity layer 2 from the nanopillar array structure surface is LD everywhere in the plane. For this reason, the number of photocarriers occurring in the impurity layer 2 is few compared with the case of the structure of the solar battery cell shown in FIG. 7. However, if an incident direction of solar light as shown in FIG. 9 is assumed, the impurity layer 2 formed on a sidewall part of the nanopillar will be equivalent to a film thickness of the nanopillar of height H. As described above, since LD<H holds in the structure of the other solar battery cell shown in FIG. 8, a fact that the film thickness of the impurity layer 2 formed on the sidewall part of the nanopillar means that the sidewall part of the nanopillar is an impurity layer thicker than another region in the plane. Therefore, in the structure of the other solar battery cell shown in FIG. 8, the number of photocarriers occurring in the impurity layer 2 is not identical to that of the case of the solar battery cell whose surface is a flat surface.

Figure 14:
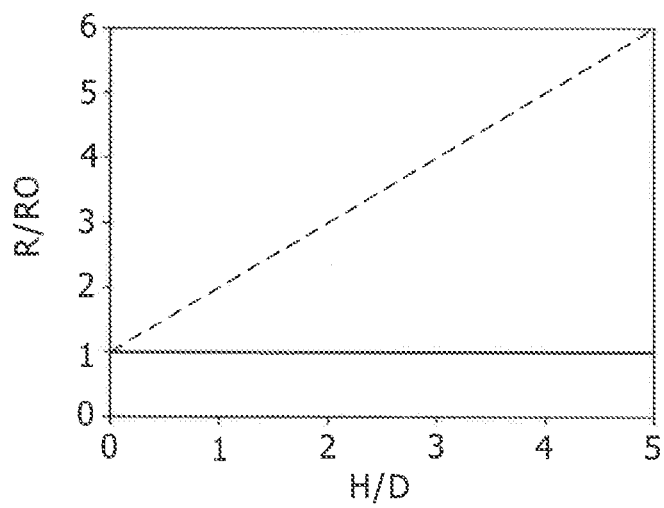
FIG. 14 shows rates of increase R/R0 of a transverse direction resistance of the impurity layer in the solar battery cell according to a third embodiment of the present invention, in which a solid line corresponds to a case of a structure of this third embodiment, and a dashed line corresponds to a case of a structure of a comparative example of this third embodiment, respectively.
Figure 15:
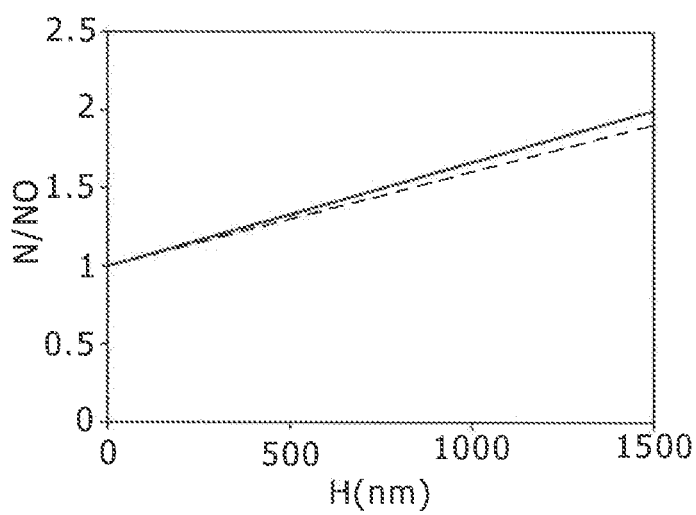
FIG. 15 shows rates of increase N/N0 of the number of photocarriers occurring in the impurity layer in the solar battery cell according to the third embodiment of the present invention, in which a solid line corresponds to the case of the structure of this third embodiment, and a dashed line corresponds to the case of the structure of the comparative example of this third embodiment, respectively.

What was described above will be quantified. The transverse migration resistance of the impurity layer 2 in the solar battery cell that has the nanopillar array structure and the number of photocarriers occurring in the impurity layer 2 are denoted by R and N, respectively, and the transverse migration resistance of the impurity layer 2 in the solar battery cell whose surface is a flat surface and the number of photocarriers occurring in the impurity layer 2 are denoted by R0 and N0, respectively. Results of calculating R/R0 and N/N0 by assuming a two-dimensional model are shown in FIG. 14 and FIG. 15, respectively. In either one of the figures, a solid line corresponds to the case of the structure of the solar battery cell shown in FIG. 7, and a dashed line corresponds to the case of the structure of the other solar battery cell shown in FIG. 8, respectively. As described above, in the case of the structure of the solar battery cell shown in FIG. 7, R/R0 is small and N/N0 is large compared with the case of the structure of the other solar battery cell shown in FIG. 8. The R/R0 and the N/N0 are all dependent on the dimension parameters of the nanopillar array structure. To be specific, the larger the H/D, i.e., an aspect ratio of the nanopillar, the larger the R/R0 becomes; the larger the H, the larger the N/N0 becomes. Here, D is a diameter of the nanopillar and may be either D1 or D2 in the solar battery cell that has the nanopillar array comprised of multiple nanopillars having different diameters like the structures of the solar battery cell in FIG. 7 and of the other solar battery cell shown in FIG. 8.

In the structure of the solar battery cell shown in FIG. 7, R/R0=1 holds irrespective of the aspect ratio of the nanopillar from FIG. 14, and the transverse migration resistance of the impurity layer 2 does not increase compared with the case of the solar battery cell whose surface is a flat surface, as described above. Moreover, as described above, since the structure of the solar battery cell shown in FIG. 7 is characterized by the height H of the nanopillar being less than or equal to 500 nm, 1<N/N0<1.33 holds from FIG. 15. That is, the number of photocarriers occurring in the impurity layer 2 can be controlled within a range of one to 1.33 times that of the case of the solar battery cell whose surface is a flat surface. Thus, even in the case of the solar battery cell that has the nanopillar array structure on its surface, by using the structure of the solar battery cell shown in FIG. 7, it is possible to suppress the transverse migration resistance of the impurity layer 2 and the characteristics degradation of the solar cell resulting from the number of photocarriers occurring in the impurity layer 2 to a minimum compared with the case of the solar battery cell whose surface is a flat surface. Also in the other solar battery cell shown in FIG. 8, the number of photocarriers is large compared with the conventional case from FIG. 15. However, the transverse migration resistance is dependent on H/D from FIG. 14. Therefore, it is possible to improve the characteristics also in the other solar battery cell shown in FIG. 8 by adopting a configuration that makes this value small.

Moreover, in the solar battery cell, it is usual that the passivation film is formed on the surface of the impurity layer 2. Although a main role of the passivation film is to terminate a dangling bond, in addition to it, what is called an electric field effect passivation that fixed electric charges contained in the passivation film suppress interface recombination by exerting a Coulomb force on minority carriers in the impurity layer 2 is being studied actively in recent years. In the solar battery cell that has the nanopillar array structure on its surface, more effective electric-field effect passivation compared with the case of the solar battery cell whose surface is a flat surface is realizable by setting up an amount of fixed electric charges so that the distance over which the electric-field effect passivation spreads may become equivalent to or more than the diameter of the nanopillar.

The formation methods of the impurity layer 2 include impurity diffusion methods such as ion implantation, a vapor phase diffusion method, and a solid phase diffusion method, and film formation methods such as the CVD method, the sputtering method, the epitaxy method, and the vapor deposition method. According to the former method, a material of the impurity layer 2 and a material of the substrate 1 are the same; according to the latter method, the material of the impurity layer 2 and the material of the substrate 1 may be the same or may be different. When forming the structure of the solar battery cell shown in FIG. 7, it is desirable to first form the impurity layer 2 and subsequently to form the nanopillar array structure by the processing method described in the first embodiment. Incidentally, when forming the structure of the other solar battery cell shown in FIG. 8, it is desirable to first form the nanopillar array structure and subsequently to form the impurity layer 2 by the impurity diffusion method.

As described above, the invention made by the present inventors was concretely explained based on the embodiments, but the present invention is not limited to the above-mentioned embodiments, and can be variously modified within a range not departing from its gist. For example, the above-mentioned embodiments were explained in detail in order to explain the present invention plainly, and the present invention is not necessarily limited to one that has all the configurations so far explained. Moreover, it is also possible to replace a part of a configuration of a certain embodiment with a configuration of another embodiment, and it is also possible to add a configuration of the other embodiment to the configuration of the certain embodiment. Moreover, regarding a part of the configuration of each embodiment, it is possible to add, delete, and replace the other configuration.

LIST OF REFERENCE SIGNS

1 . . . Substrate, 2 . . . Impurity layer, 3 . . . Solar light, 4 . . . Nanopillar, 11 . . . Nanopillar of diameter D1, 12 . . . Nanopillar of diameter D2, 13 . . . Nanopillar of diameter D3, 14 . . . Nanopillar of diameter D4, 15 . . . Nanopillar of diameter D5, 16 . . . Nanopillar of diameter D6, 17 . . . Nanopillar of diameter D7, 18 . . . Nanopillar of diameter D8, 21 . . . Nanopillar array structure comprised of two types of nanopillars having different diameters, 22 . . . First nanopillar array structure comprised of three types of nanopillars having different diameters, 23 . . . Second nanopillar array structure comprised of three types of nanopillars having different diameters, 31 . . . Nanopillar of diameter DD1 and height HH1, 32 . . . Nanopillar of diameter DD2 and height HH2, 41 . . . Nanopillar array structure comprised of two types of nanopillars having different diameters and different heights, respectively

The invention claimed is:

1. A solar cell, comprising:
a substrate;
a plurality of first cylindrical pillars connected with the substrate; and
a plurality of second cylindrical pillars connected with the substrate,
wherein a diameter of the second pillar is larger than a diameter of the first pillar,
wherein the plurality of first cylindrical pillars are arranged periodically, and the plurality of second cylindrical pillars are arranged periodically, and
wherein the second pillar is disposed between at least two collinear ones of the plurality of first cylindrical pillars.

2. The solar cell according to claim 1,
wherein the diameter of the first pillar is not less than 20 nm and less than 50 nm, and the diameter of the second pillar is not less than 50 nm and not more than 150 nm.

3. The solar cell according to claim 2,
wherein both a height of the first pillar and a height of the second pillar are not less than 100 nm and not more than 1000 nm.

4. The solar cell according to claim 3,
wherein a gap between the first pillar and the second pillar is not less than 1/5 times the diameter of the first pillar and is not more than five times the diameter of the second pillar.

5. The solar cell according to claim 4,
wherein the substrate is a substrate having a first conduction type,
wherein the solar cell further comprises an impurity layer of a second conduction type different from the first conduction type that is formed on a part of the substrate, the first pillar, and the second pillar, and
wherein an interface of a pn junction or pin junction that is formed with the substrate and the impurity layer is flat.

6. The solar cell according to claim 5,
wherein the height of the first pillar is less than or equal to 500 nm, and the height of the second pillar is less than or equal to 500 nm.

7. The solar cell according to claim 3, further comprising:
a plurality of third cylindrical pillars connected with the substrate,
wherein a diameter of the third pillar exceeds the diameter of the second pillar.

8. The solar cell according to claim 7,
wherein the diameter of the first pillar is not less than 20 nm and less than 50 nm, the diameter of the second pillar is not less than 50 nm and less than 90 nm, and a diameter of the third pillar is not less than 90 nm and not more than 150 nm.

9. The solar cell according to claim 8, wherein all of the gap between the first pillar and the second pillar, a gap between the first pillar and the third pillar, and a gap between the second pillar and the third pillar are each not less than ⅕ times the diameter of the first pillar and not more than 5 times the diameter of the third pillar.

10. The solar cell according to claim 3, further comprising:
a plurality of fourth cylindrical pillars each connected with the substrate through the second pillar; and
a plurality of fifth cylindrical pillars each connected with the substrate through the second pillar and being different from the fourth pillar,
wherein the diameter of the second pillar exceeds a diameter of the fourth pillar, and the diameter of the second pillar exceeds a diameter of the fifth pillar.

11. The solar cell according to claim 10, wherein the diameter of the fourth pillar is not less than 20 nm and less than 50 nm, and the diameter of the fifth pillar is not less than 20 nm and less than 50 nm.

12. The solar cell according to claim 11, wherein a gap between the fourth pillar and the fifth pillar is not less than ⅕ times the diameter of the fourth pillar and not more than five times the diameter of the second pillar.

13. The solar cell according to claim 1, wherein the plurality of first cylindrical pillars and the plurality of second cylindrical pillars are arranged in a checkerboard pattern.

14. A solar cell, comprising:
a pn junction or pin junction;
a first pillar having a first diameter;
a second pillar having a second diameter that is different from the first diameter; and
a plurality of array unit structures each comprising the first pillar and the second pillar,
wherein each array unit structure is arranged periodically with respect to other array unit structures.

15. The solar cell according to claim 14, wherein the unit structure of the array further contains a third pillar whose diameter is different from those of the first and second pillars.

* * * * *